United States Patent [19]
Hatfield

[11] Patent Number: 4,720,673
[45] Date of Patent: Jan. 19, 1988

[54] SPECTRUM ANALYZER AND LOGARITHMIC AMPLIFIER THEREFOR

[75] Inventor: R. Andrew Hatfield, Richmond, Va.

[73] Assignee: Avcom of Virginia, Inc., Richmond, Va.

[21] Appl. No.: 734,115

[22] Filed: May 15, 1985

[51] Int. Cl.$^4$ .............................................. G01R 23/16
[52] U.S. Cl. .................................... 324/77 B; 455/325
[58] Field of Search ............. 343/5 NQ, 5 DP, 5 SW; 455/325, 327; 324/77 R, 77 A, 77 B, 77 C, 77 CS

[56] References Cited

U.S. PATENT DOCUMENTS

| | | | |
|---|---|---|---|
| Re. 30,781 | 10/1981 | Miyamoto | 328/145 |
| 3,918,054 | 11/1975 | Collins | 343/5 DP |
| 4,000,469 | 12/1976 | McMaster | 455/327 |
| 4,001,590 | 1/1977 | Corte et al. | 328/145 |
| 4,090,150 | 5/1978 | Vachenauer | 328/145 |
| 4,091,329 | 5/1978 | Fletcher et al. | 328/145 |
| 4,234,851 | 11/1980 | Hartman | 328/145 |
| 4,241,345 | 12/1980 | Johnson | 343/5 SW |
| 4,333,080 | 6/1982 | Collins | 343/5 NQ |
| 4,356,449 | 10/1982 | Thomas | 328/145 |
| 4,418,317 | 11/1983 | Bateman | 328/145 |
| 4,545,073 | 10/1985 | Dixon, Jr. | 455/325 |

OTHER PUBLICATIONS

"Poor Man's Spectrum Analyzer", 73 Magazine, Aug. 1982, by Frank H. Perkins.

Primary Examiner—Michael J. Tokar
Attorney, Agent, or Firm—Schwartz, Jeffery, Schwaab, Mack, Blumenthal & Evans

[57] ABSTRACT

The spectrum analyzer comprises an input for receiving electromagnetic signals in a predetermined first frequency band and an image reject mixer for reducing the power of images of the received signals while down-converting the signals to an intermediate frequency. The image reject mixer reduces the signal power level to approximately that of the background noise of the signal. The mixer is swept through a predetermined frequency band in order to down-convert each frequency in the received signal band individually. The down-converted signals are logarithmically compressed using a multi-stage logarithmic compression circuit having variable gain amplifiers in each stage.

17 Claims, 5 Drawing Figures

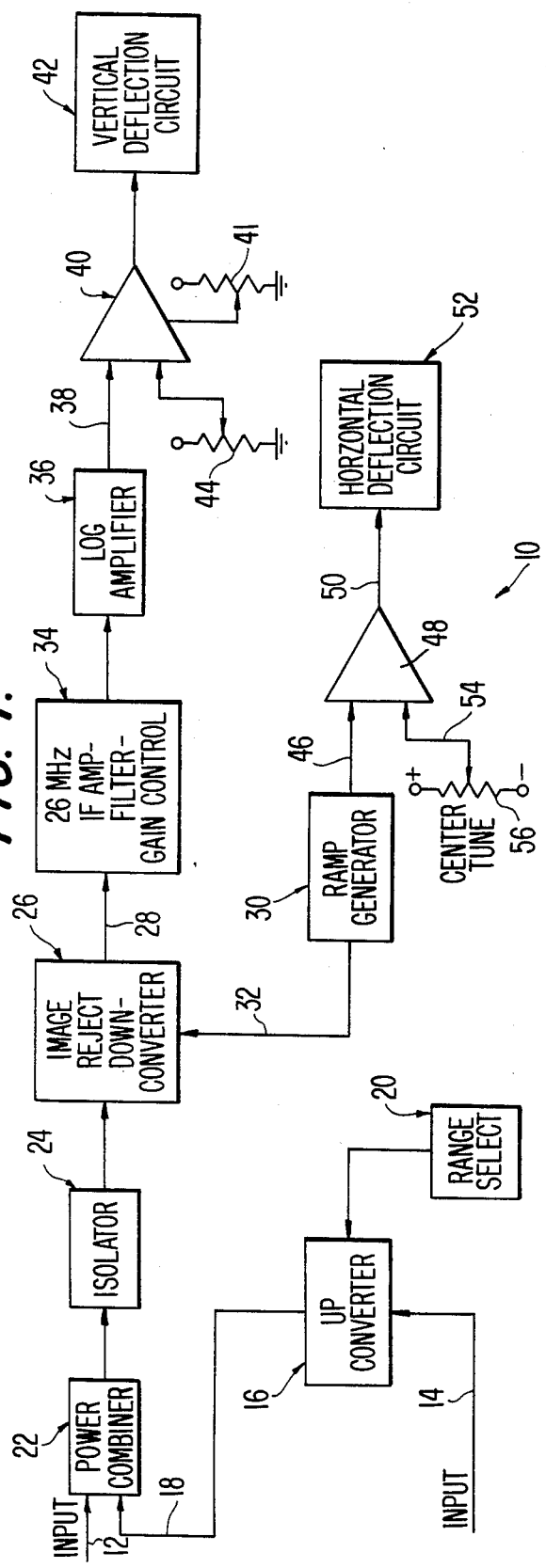
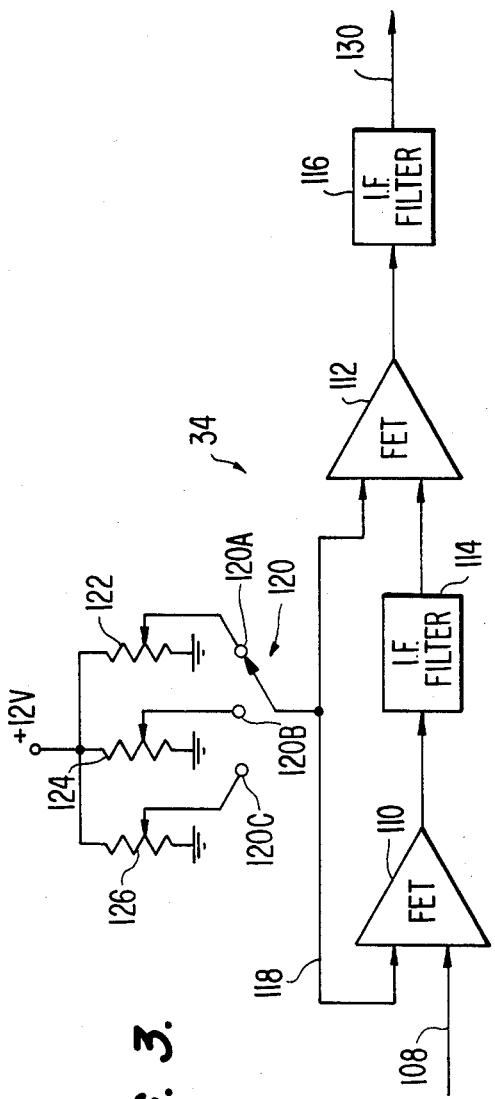
FIG. 1.
FIG. 3.

SPECTRUM ANALYZER AND LOGARITHMIC AMPLIFIER THEREFOR

BACKGROUND OF THE INVENTION

1. Field of the Invention

The present invention relates to spectrum analyzers, and more particularly, to a spectrum analyzer which is particularly adapted for use with the broad range of signals encountered in the satellite communication industry.

2. Discussion of Related Art

Modern communication systems operate in the microwave range. These systems include satellite systems wherein the signals are received at earth-mounted dish antennas. After reception, the signals are down-converted to frequency bands where signal processing is more practical and where the signals can be processed using lumped components, rather than distributed components which are typically utilized in microwave circuits.

Signals received from communications satellites include a high level of background noise. The signals themselves are usually 10 to 20 dB above this noise level. In order to adequately test for and analyze malfunctions in the receiving equipment, it must first be determined whether the proper signal levels are being received and whether there are any spurious signals or noise present which might interfere with the proper processing of the received signals.

Spectrum analyzers are conventionally used for determining the presence of electromagnetic energies in a predetermined band. However, these analyzers are normally very expensive and highly sophisticated instruments which are not particularly adapted for use in checking for spurious noise or signals at the input site of a dish antenna receiving signals from a communications satellite. Thus, there has developed a need for a relatively inexpensive, durable, lightweight, portable spectrum analyzer which is particularly suited for the needs of the satellite communication industry.

SUMMARY OF THE INVENTION

One object of the present invention is to provide a spectrum analyzer which is particularly adapted for use in analyzing signals above 1000 megahertz.

Another object of the present invention is to provide a spectrum analyzer which can analyze a large frequency band or a plurality of frequency bands in the microwave range while using a minimal number of components.

A still further object of the present invention is to provide a spectrum analyzer which takes into consideration the high level of background noise in a satellite communication system so as to match the image rejection capability of the instrument to the background noise level.

Yet another object of the present invention is to provide a spectrum analyzer for use with microwave signals which analyzer is portable, compact and provides an accurate indication of the signal level in the band being monitored.

Another object of the present invention is to provide a logarithmic amplifier which can be used in the spectrum analyzer of the present invention or which can be used in other applications requiring logarithmic conversions of a signal.

Yet another object of the present invention is to provide a logarithmic amplifier which provides highly accurate logarithmic compression of input signals over an extended dynamic range.

In accordance with the above and other objects, the present invention includes a spectrum analyzer comprising an input for receiving electromagnetic signals in a predetermined first frequency band. A circuit is provided for down-converting the received signals to an intermediate frequency. The down-converting circuit includes a swept frequency image reject mixer for reducing the power of images of the received signals while down-converting the signals. This combination of an image reject mixer and a sweep circuit for sweeping the local oscillator of the mixer is referred to herein as an image reject down-converter. A display is operated in synchronism with the swept signal for displaying the amplitude of each down-converted signal.

In accordance with other aspects of the invention, the input includes a circuit for receiving signals in a second frequency band, up-converting the signals in the second frequency band to the first frequency band, and feeding the up-converted signals to the down-converter.

Further, means are provided for selectively inputting either the signals received in the first frequency band or the up-converted signals to the down-converter.

The image reject down-converter according to the invention includes a quadrature hybrid circuit for producing two outputs with a 90° phase difference. Also, a mixer is provided for mixing each of the outputs with the same frequency signal. A second quadrature hybrid circuit is provided for combining the two mixed signals into a single output signal having an image which is substantially below the main signal energy content.

The spectrum analyzer is particularly adapted for use where there is a high level of background noise. In accordance with the invention, the image reject down-converter reduces the image signal to a level approximating or below the level of the noise rather than eliminating the image entirely. The display is then driven such that only signals having a power greater than the background noise level are displayed.

Also in accordance with the invention, a logarithmic amplifier is included comprising a plurality of cascaded stages. Each stage includes an amplifier having a variable gain, an input for controlling the variable gain, a signal input for receiving a signal to be amplified, and an amplified signal output. A feedback path is connected between the amplified signal output and the gain control input. The feedback path includes a circuit for controlling the gain of the amplifier such that an AC component of a signal on the amplified signal output is the logarithm of an AC component of a signal on the signal input. Outputs of the gain control circuits from the cascaded stages are added to each other to provide a combined output which covers a greater dynamic range than a single stage.

The amplifier of each stage of the logarithmic amplifier may comprise a dual gate depletion-type insulated gate field effect transistor.

BRIEF DESCRIPTION OF THE DRAWINGS

The above and other objects of the present invention will be more readily apparent as the invention becomes more fully understood from the following detailed description taken in consideration with the accompanying drawings, in which:

FIG. 1 is a block diagram of the frequency analyzer of the present invention;

FIG. 3 is a more detailed schematic showing the 26 MHz IF Amplifier-Filter-Gain control circuit of FIG. 1;

DETAILED DESCRIPTION OF THE PREFERRED EMBODIMENT

Figure 2:
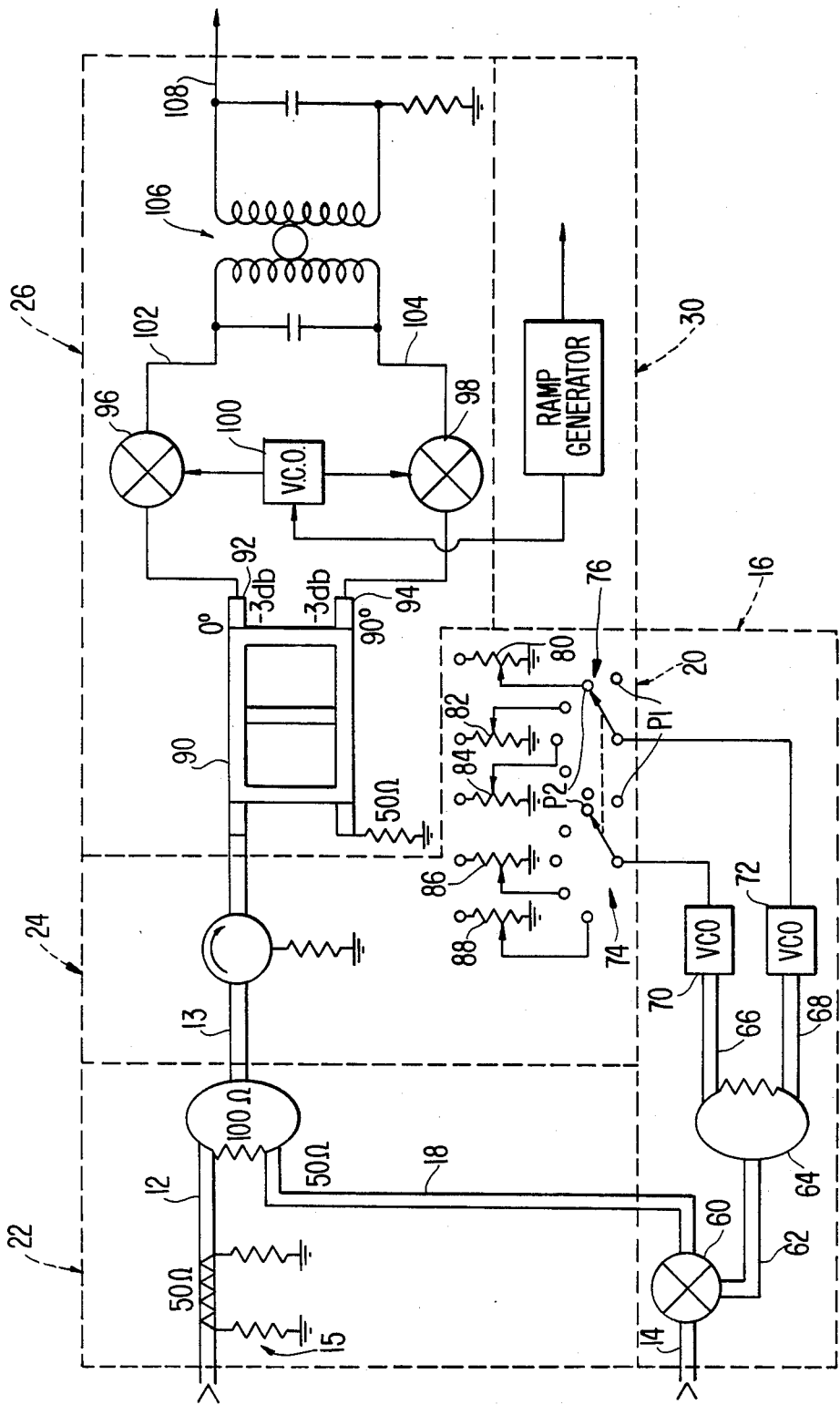
FIG. 2 is a more detailed schematic showing the range select circuit, up-converter, power divider, isolator and image reject down-converter of FIG. 1.

FIG. 1 shows the spectrum analyzer 10 of the present invention. Analyzer 10 has two inputs on lines 12 and 14, respectively. Line 12 is adapted to receive signals in the range of 3.7 to 4.2 GHz. Input line 14 is adapted to receive signals in the range of 10 to 1500 MHz. The signals on line 14 are converted to the 3.7 to 4.2 GHz range by up-converter 16 which produces an output on line 18. In practice, the 10 to 1500 MHz range is divided into five subranges of 10 to 500, 270 to 770, 400 to 900, and 950 to 1450 MHz, respectively. A range select circuit 20 determines which of the five ranges will be up-converted by up-converter 16.

The signals on lines 12 and 18 are passed to a power combiner 22 which acts to add the signals together. In practice, only one of the input lines 12 and 14 will be used at a time so that the output of power combiner 22 comprises only the input signals on the line in use. The output of power combiner 22 is passed to isolator 24 which permits microwave signals to pass only to image reject down-converter 26. Image reject down-converter 26 provides an output on a line 28. This output is an intermediate frequency signal having a frequency of 26 MHz. Image reject down-converter 26 is swept through the frequency range of 3.7 to 4.2 GHz by a ramp generator 30 via a control signal on line 32. Thus, each frequency in the range of 3.7 to 4.2 GHz is individually down-converted to 26 MHz. Image reject down-converter 26 also reduces the power level of the image component of the received signal by 20 dB over the main component. That is, the down-converter 26 separates the image signal from the main signal and produces image rejection of 20 to 30 dB without the use of filters.

The output of down-converter 26 is passed to a 26 MHz IF amplifier-filter-gain control circuit 34 which controls the sensitivity and dynamic range of the analyzer 10.

The output of control circuit 34 is passed to log amplifier 36 which produces an output on line 38 which is logarithmic function of the signal received from sensitivity control 34. The logarithmically compressed signal on line 38 is passed through a variable gain differential amplifier 40 to the vertical deflection circuit 42 of a CRT display to provide the amplitude component of the display signal. In differntial amplifier 40, a reference signal from potentiometer 44 is subtracted from the signal on line 38 to control the vertical centering of the displayed signal. A signal from potentiometer 41 controls the magnitude of the displayed signal.

A second output from ramp generator 30 is provided on line 46 to a second differential amplifier 48. The output of differential amplifier 48 is passed along line 50 to the horizontal deflection circuit 52 of the CRT. Thus, the horizontal sweep is synchronized with the instantaneous frequency of the image reject down-converter so that the displayed amplitude on the CRT will correspond to a predetermined frequency in accordance with the output of ramp generator 30. A second input to differential amplifier 48 is received on line 54 from a second potentiometer 56. This input controls the center position of the displayed signal.

The frequency analyzer 10 requires a minimal number of components. This is accomplished by the fact that a single image reject down-converter 26 can be used to down-convert all of the signals whether received on input lines 12 or 14. This down-converter produces both the down-converting function and the image reject function. No filters are necessary to eliminate the image signal. The reason that an image reject down-converter can be used in place of filters is that analyzer 10 is designed for use in satellite communication systems where a high level of background noise is present. The signals levels are 10 to 20 dB above the background noise level. Consequently, by reducing the image signal by 20 to 30 dB by down-converter 26, the power level of the image signal approximates that of the noise level. Circuit 34 can then be adjusted to set the reference level 20 to 30 dB above the signal level so that the noise and image signals are 40 to 60 dB below the reference level and are not viewed on the CRT screen. This technique provides an accurate display using simplified circuitry.

Image reject mixers of the type used in down-converter 26 normally have a usable bandwidth of approximately 15-20% of center frequency. This corresponds to a 500 MHz bandwidth in the 3.7 to 4.2 GHz range permitted on input line 12. This is also the reason that the signal range of 10 to 1500 MHz on line 14 must be divided into 500 Mhz increments to be compatible with image reject down-converter 26. In order that the 500 MHz increments can be achieved, range select circuit 20 is used to control up-converter 16. The up-converter 16 provides a technique for enabling all of the received signals on line 14 to be processed by a single image reject down-converter. No filters or duplication of the image reject down-converter is required. By simply up-converting the signals to the frequency range accepted by image reject down-converter 26, all of the signals on line 14 can be processed. This technique can be extended to any frequency range by providing the appropriate up-converter.

FIG. 2 shows the details of the power divider 22, isolator 24, image reject down-converter 26, up-converter 16, range select circuit 20 and ramp generator 30.

The power combiner 22 comprises a conventional Wilkinson Power Combiner having a 50 ohm input transmission line 12, a 50 ohm input transmission line 18, and a 50 ohm output transmission line 13. The signal on line 13 comprises an addition of the signals on transmission lines 12 and 18. As discussed above, in use, a signal will appear either on transmission line 12 or transmission line 18 and not on both transmission lines at the same time. Thus, power combiner 22 channels the signal which is present to the transmission line 13.

The signal on transmission line 18 is received from a mixer 60 which has one input from transmission line 14. As discussed above, signals on transmission line 14 are in the 10 to 1500 MHz range. A second input on a transmission line 62 is received from a second power combiner 64 having inputs on transmission lines 66 and 68 from voltage-tuned oscillators 70 and 72, respectively.

Oscillators 70 and 72 are controlled by range select circuit 20 which has two switches 74 and 76 to operate oscillators 70 and 72, respectively. The switches 70 and 76 each have 6 positions and are ganged together. In the first position, P1, both oscillators are off. This is the position to which the range select is set when an input is provided on transmission line 12. In the second position, P2, oscillator 72 is connected to a potentiometer 80. Potentiometer 80 can be adjusted by the user to set oscillator 72 at a desired frequency to up-convert a desired frequency band. The remaining positions of range select circuit 20 are preset by four additional potentiometers 82, 84, 86, and 88.

In a third position of the range select switch 20, potentiometer 82 sets oscillator 72 at an oscillation frequency of 2.75 GHz in order to up-convert signals in the frequency range 950 to 1450 MHz to the frequency range of 3.7 to 4.2 GHz. In the fourth position of range select switch 20, potentiometer 84 is connected to oscillator 72 and sets the frequency of oscillation at 3.3 GHz in order to up-convert signals in the range of 400 to 900 MHz.

In positions 1, 2, 3 and 4, oscillator 70 is not operated. In position 5, oscillator 72 is not operated and oscillator 70 provides a frequency of 3.43 GHz to up-convert signals in a range of 270 to 770 MHz. In the sixth switch position, oscillator 70 is connected to potentiometer 88 and produces a frequency of 3.7 GHz to up-convert signals in the range of 0 to 500 MHz.

Clearly, since only one of the oscillators 70 and 72 is operated at a time, the signals from the operating oscillator are passed to mixer 60 to up-convert the corresponding signals on input waveguide 14. During operation of oscillator 70 or 72, the input to transmission line 12 is not used so that the signal on line 13 comprises the up-converted signal. Conversely, when the input to transmission line 12 is being used, the range select switch 20 is in the first position so that no signals are provided on transmission line 18 and the signal on transmission line 30 is the signal received on transmission line 12.

Isolator 24 comprises a conventional microwave isolator which permits microwave energy to pass from power combiner 22 to down-converter 26 only. Energy produced in down-converter 26 is not permitted to return through isolator 24. Use of an isolator has been found to reduce spurious responses in the display. An 8 dB attenuator 15 can be used to reduce the signal level on transmission line 12 to match that on transmission 18 since up-converter 16 reduce the power level by 8 dB.

The image reject down-converter 26 comprises an image reject mixer of conventional design together with a variable frequency local oscillator. The mixer has a first quadrature hybrid 90 which receives the output of isolator 24 and produces two outputs with a 90° relative phase difference. One output is at port 92 and is marked 0°. The other output is at port 94 and has a 90° phase difference relative to port 92 output. The signals at port 92 and 94 are at one half the power level of the inputted signal. The signals from port 92 and 94 are passed to mixers 96 and 98, respectively where they are down-converted by the output of voltage-tuned oscillator 100.

The image reject down-converter is driven by a ramp generator 30 to sweep oscillator 100 through the frequency range of 3.726 GHz to 4.226 GHz so as to produce an intermediate frequency output of 26 MHz on lines 102 and 104, respectively. These outputs are inputted to two ports of a quadrature hybrid 106 which combines these signals, which have a 90° phase difference, and outputs the 26 MHz intermediate frequency on line 108. Quadrature hybrid 106 comprises a ten turn bifilar transformer on a ferrite bead.

As is well known, an image reject mixer combining two balanced mixers and associated hybrid circuits can produce image rejection of up to 30 dB without the use of filters. By sweeping the image reject mixer through the frequency band of 3.726 to 4,226 GHz, an image reject down-converter is produced in which the outputted intermediate frequency signal on line 108 contains a sequential presentation of the frequency spectra of the signals received from transmission line 13. Thus, by presenting this signal on a CRT, spectral analysis of the frequency range of interest can be performed.

Ramp generator 30 is used to control the frequency of oscillator 100 to sweep it through the desired range of 3.726 to 4.226 GHz.

FIG. 3 shows the 26 MHz amplifier, filter and gain control circuit 34 which essentially comprises a pair of dual-gate field effect transistors 110 and 112 followed respectively by intermediate filters 114 and 116. The sensitivity and dynamic range of the spectrum analyzer are controlled by changing the input to the gain control gate of FETs 110 and 112 by changing the voltage on line 118. Line 118 extends to a single pole switch 120 which has three possible positions indicated by 120A, 120B and 120C. The voltage at position at 120A is controlled by a potentiometer 122 while the voltage at positions 120B and 120C are controlled, respectively, by potentiometers 124 and 126.

Potentiometers 122, 124 and 126 can be set to any desired level. However, in practice, potentiometer 122 is set to provide the maximum expected gain necessary, potentiometer 124 is set to provide a gain of −20 dB relative to potentiometer 122, and potentiometer 126 is set to provide a gain of −40 dB relative to potentiometer 122. Switch 120 is accessible by the operator of the spectrum analyzer so that the gain level can quickly be changed resulting in three display reference levels of 0 dBm, −20 dBm, and −40 dBm.

Filters 114 and 116 are IF filters designed to pass 26 MHz signals.

Figure 4:
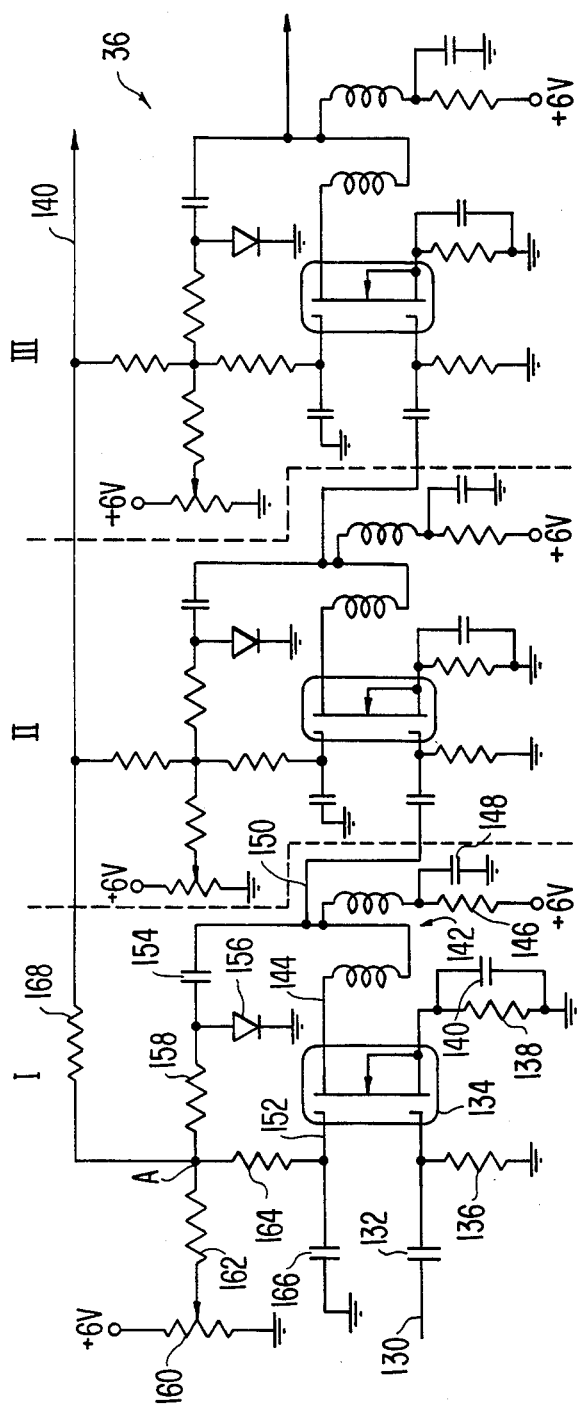
FIG. 4 is a schematic showing several stages of the log amplifier of FIG. 1.

The output of 26 MHz IF amplifier, filter and gain control circuit 34 is presented on line 130 to log amplifier 36, shown in FIG. 4. Logarithmic amplifier 36 comprises a plurality of amplifier stages. The stages are connected in cascade but their logarithmic outputs are added to form a single output on line 140.

In FIG. 4, three stages are shown labeled I, II and III. The elements in each stage are identical. Accordingly, only the elements of stage I are labeled for clarity.

In stage I, input line 130 is connected to DC blocking capacitor 132, the output of which is connected to one gate of an N-channel dual-gate depletion-type insulated gate field effect transistor 134. Transistor 134 may be a Texas Instruments 3N212. A 500 ohm resistor 136 is connected from the first transistor gate to ground. The source of transistor 134 is connected to the parallel combination of 180 ohm resistor 138 and a 0.01 μf capacitor 140 to ground. The drain of transistor 134 provides a signal output through line 144 to the primary of a three turn bifilar transformer 142. Transformer 142 is provided for matching the output impedance of stage I to the input impedance of stage II.

The secondary of transformer 142 has one side connected to a +6 volt supply through a 150 ohm resistor 146, and to ground through a 0.01 μf capacitor 148. The other side of the secondary of transformer 142 is connected through line 150 to the input of stage II. Furthermore, the other side of the secondary of transformer 142 is connected to a feedback loop leading to the gain control gate 152 of transistor 134.

The feedback loop includes a DC blocking capacitor 154 having a value of 47 pf which is connected to the anode of a diode 156. The cathode of diode 156 is connected to ground. Diode 156 may be a 1SS98 hot carrier diode. The anode of diode 156 is connected to one side of a 10K ohm resistor 158, the other side of which is connected to a point A. Point A receives a voltage from a potentimeter 160 through a 10K ohm resistor 162. Point A is also connected to the gain control gate 152 through a 10K ohm resistor 164. The gain control gate 152 is connected through a 220 pf capacitor 166 to ground. Finally, point A is connected through a 10K ohm resistor 168 to the logarithmic output line 140.

In operation, potentiometer 160 is set in a manner to be discussed to bias gain control gate 152 so as to set a particular gain in transistor 134. Thus, a small signal is amplified and passed to bifilar transformer 142. The amplified signal is passed to stage II and passed back to the gain control gate 152 through the feedback path. Capacitor 154 blocks any DC signals and diode 156 permits only a negative voltage derived from the feedback signal to pass to point A. This negative voltage thus reduces the voltage at point A thereby reducing the bias potential on the gain control gate 152. Capacitor 166 acts as a filter to provide a low impedance a.c. ground. With a very small signal level, the feedback voltage is negligible and maximum stage gain is achieved. As the input signal on line 130 increases, the amplitude of the negative voltage feedback developed by diode 156 increases and is added to the voltage of point A, so that the gain of transistor 134 decreases. The voltage at level A is tapped off through resistor 168 to provide a signal indicative of the logarithm of the input voltage.

The use of a plurality of stages increases the accuracy and the dynamic range of the logarithmic amplifier. In all, a total of 9 stages is used in practice for achieving a 70 dB range.

In order to properly adjust the potentiometer 160 of each stage, a signal at the operating frequency should be injected in that stage at a level of approximately 5 dBm. The potentiometer 160 of that stage is then set so that point A of the corresponding stage is at approximately 0.3 volts for a 26 MHz signal or at 0.16 volts for a 10 MHz signal. With each stage properly biased, the voltage at the anode of diode 156 will range from approximately −0.3 volts for a strong input signal to approximately +0.3 volts for a week input signal. The corresponding output signal at point A will range from approximately +0.2 volts for a strong input signal to approximately +0.4 volts for a weak input signal.

The plurality of stages of the logarithmic amplifier provide both increased accuracy as well as increased dynamic range. Since the stages are cascaded, the amplified signal increases in magnitude from stage-to-stage so that each successive stage limits prior to the earlier stages. In the embodiment shown, where nine stages are used (only the first three stages being shown in the drawing) stage IX would limit first, then stage VIII, then stage VII . . . then stage 1. Accordingly, as each stage limits, the amplification provided by that stage is no longer present in the next succeeding increment of signal input to the logarithmic amplifier. Thus, a variable gain characteristic is achieved by cascading the stages. The smallest signals are amplified by all of the stages, thus achieving maximum amplification. Each succeeding increment of input signal is amplified by fewer stages until the strongest increment of input signal is amplified only by stage I. In addition, the amplification of each stage decreases as it approaches its limit. At the same time the output of the next succeeding stage increases so that the addition of the outputs from all of the stages provides a smooth and accurate logarithmic response. In fact, using nine stages, an accuracy of ±1 dB over a range of 70 dB has been achieved in practice.

Turning again to FIG. 1, it will be seen that the output of log amplifier 38 is passed to operational amplifier 40 and that vertical centering of the signal on the CRT display is controlled by potentiometer 44. Operational amplifier 40 has a variable gain which is controlled by a potentiometer 41. Accordingly, the actual vertical extent of the output in terms of volts per division on the CRT display can be accurately controlled.

Figure 5:
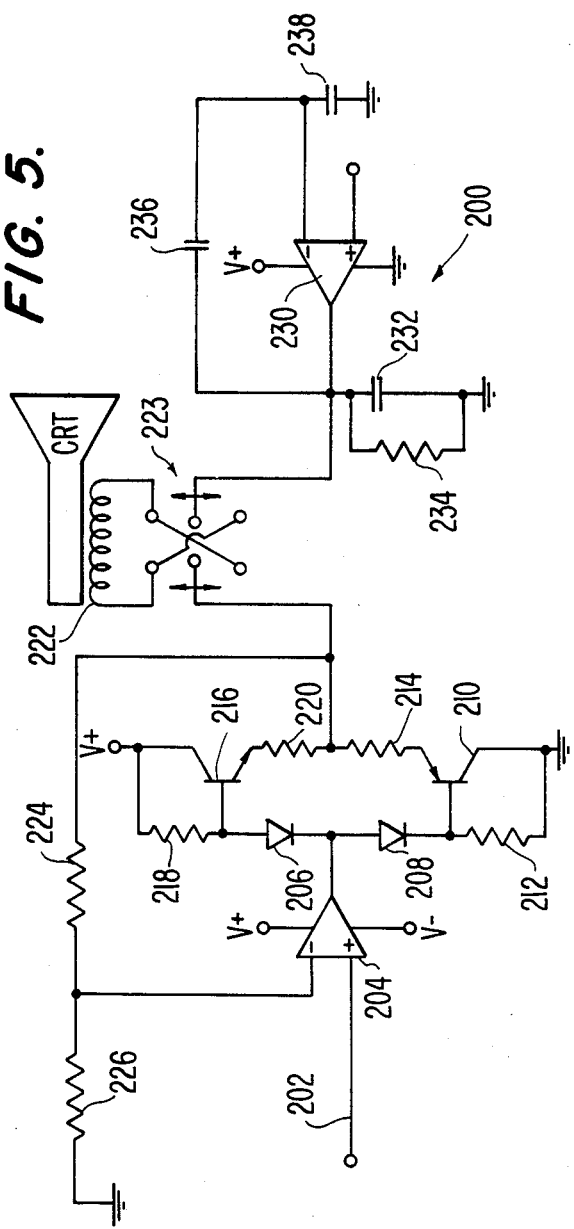
FIG. 5 is a schematic showing the vertical deflection circuit of the present invention.

FIG. 5 shows a deflection circuit 200 which can be used either as the vertical deflection circuit 42 of FIG. 1 or as the horizontal deflection circuit 52.

Deflection circuit 200 includes an input line 202 which is connected to the noninverting input of a general purpose operational amplifier 204. The output of amplifier 204 is connected between the cathode of a diode 206 in the anode of a diode 208. The cathode of diode 208 is connected to the base of a PNP transistor 210, whose base is also connected to ground through a biasing resistor 212. The collector of transistor 210 is grounded while the emitter is connected to a resistor 214. An NPN transistor 216 forms a symmetrical circuit having its base connected to the anode of diode 206 and to a resistor 218 which is also connected to a positive biasing voltage. The collector of transistor 216 is also connected to the positive voltage while its emitter is connected to a resistor 220. Resistors 214 and 220 are connected together and to one side of deflection coil 222 through a PPDT switch. The deflection coil is also connected through a voltage divider comprising a resistor 224 and a resistor 226 to the inverting input of operational amplifier 204. The other side of coil 222 is connected through switch 223 to the output of a National Semiconductor LM383 operational amplifier 230. This output is also connected to ground through the parallel combination of a 10 μf capacitor 232 and a 270 ohm resistor 234. In addition, this output is connected through an AC voltage divider comprising a 10 μf capacitor 236 and a second 10 μf capacitor 238 to the inverting input of operational amplifier 230.

Operational amplifier 230 has the characteristic that the noninverting input and the output are internally self biased to a voltage equal to one-half of the amplifier power supply voltage V+. Furthermore, this operational amplifier is capable of holding its DC bias level while providing high AC currents necessary for driving deflection coil 222.

The noninverting input of amplifier 230 is disconnected so that the internal self bias holds it at one-half of the amplifier power supply voltage. The output of amplifier 230 holds one side of coil 222 at one-half this power supply voltage while the voltage on the other side of coil 222 is altered by operational amplifier 204 in response to the input signal on line 202. Line 202 could be the input from either operational amplifier 40 of FIG. 1 or operational amplifier 48 of FIG. 1.

Clearly, the output of operational amplifier 204 controls the conduction of transistors 210 and 216 through diodes 206 and 208. The output resulting from these transistors is fed back to operational amplifier 204 to ensure that the voltage at coil 222 is proportional to the input voltage on line 202.

Any spurious AC signals on the other side of coil 222 are shunted to ground through the filter network comprising capacitor 232 and resistor 234. Signals within the expected driving range of coil 222 are fed to the inverting input of operational amplifier 230 through capacitors 236 and 238 to ensure that the output of operational amplifier 230 is held at the voltage level of V+/2.

The driving circuit 200 provides a relatively simple and inexpensive yet effective and highly reliable deflection coil driving circuit which sends an AC current centered around a DC bias current of 0 amps through the coil. This 0 amp DC bias current results from transistors 216 and 210 being biased to produce an output of V+/2 when the output from operational amplifier 204 is V+/2. This output balances with the output of operational amplifier 230 so that both sides of coil 222 have the same voltage.

Switch 223 permits the sweep produced by coil 222 on the CRT to be reversed. This is particularly useful when circuit 200 is a horizontal sweep circuit. In this case, the low frequency signals which would normally be shown on the left hand side of the CRT would be shown on the right hand side of the screen and high frequencies signals which would normally be shown on the right hand side would be shown on the left hand side. The reason that such a reversal of position in the horizontal sweep would be useful is that, in the communications industry, there are some block down-converters in use for down-converting signals in the 3.7 to 4.2 GHz range to 950-1450 MHz. The local oscillator in these down-converters injects the signal on the high side so that the output of block down-converter would ordinarily be displayed on the spectrum analyzer with the 3.7 to 4.2 GH$_z$ relationship reversed. That is, the higher frequency would be shown on the left of the screen and the lower frequency would be shown on the right hand side of the screen. With switch 223 shown in FIG. 5, the display can be reversed by the operator in order to accommodate signals received from these block down-converters and make the display easier to interpret.

It should be understood that while switch 223 is shown connected directly to coil 222, this switch can be included anywhere in the deflection circuitry in order to produce a similar reversal.

The foregoing description of the preferred embodiment is presented for purposes of illustrating the present invention only. Clearly, numerous additions, substitutions and modifications can be made to the invention without departing from the scope thereof as set forth in the appended claims.

What is claimed is:

1. A spectrum analyzer comprising:
    an input means for receiving electromagnetic signals to be analyzed in a predetermined first frequency band;
    means connected to said input means for down-converting said signals to an intermediate frequency, said down converting means including an image reject mixer for reducing the power of images of said signals while down-converting said signals, and means for sweeping a mixer frequency of said image reject mixer through said band to individually down-convert signals at each frequency of said band; and
    display means operated in synchronism with said sweeping means for displaying the amplitude of each down-converted signal.

2. A spectrum analyzer as claimed in claim 1 wherein said input means includes means for receiving signals to be analyzed in a second frequency band, up-converting said signals in said second frequency band to said first frequency band, and feeding said up-converted signals to said down-converting means.

3. A spectrum analyzer as claimed in claim 2 including means for selectively inputting either said signals received in said first frequency band or said up-converted signals from said second frequency band to said down-converting means.

4. A spectrum analyzer as claimed in claim 1 wherein said image reject mixer includes a quadrature hybrid means for producing outputs with a 90° phase difference from each other, mixer means for mixing each said output from said quadrature hybrid means with the same frequency signal, and a second quadrature hybrid means for combining said two mixed signals.

5. A spectrum analyzer as claimed in claim 1 wherein said frequency band includes noise approximately 20 db below the power level of said signals to be analyzed, and said image reject mixer reduces the image signals to a level approximating or below the level of said noise.

6. A spectrum analyzer as claimed in claim 1 including a logarithmic amplifier for logarithmically compressing said downconverted signals before display by said display means.

7. A spectrum analyzer as claimed in claim 6 wherein said logarithimic amplifier comprises:
    a plurality of cascaded stages, each stage including an amplifier having a variable gain, an input for controlling said variable gain, a signal input for receiving a signal to be amplified, an amplifier output, and a feedback path connected between said amplifier output and said gain control input, said feedback path including means for controlling the gain of said amplifier such that the output of said gain control means is related to the logarithm of an AC component of a signal on said signal input;
    means for adding outputs from the gain control means of each said stage to each other; and
    means for biasing each stage such that the added outputs provide a combined output having a greater dynamic range and accuracy than a single stage and approximating a logarithm of an input signal to the first of said plurality of said stages.

8. A spectrum analyzer as claimed in claim 7 wherein each amplifier comprises a dual-gate field effect transistor.

9. A spectrum analyzer as claimed in claim 7 wherein said gain control means comprises a diode connected in said feedback loop and means for blocking the passage of a DC component of a signal from said amplifier output to said diode.

10. A spectrum analyzer as claimed in claim 7 wherein said biasing means comprises a voltage supply connected to the amplifier of each stage for producing maximum amplification for a minimum signal level.

11. A spectrum analyzer as claimed in claim 1 further including sensitivity control means comprising a variable gain intermediate frequency amplifier and means for controlling the gain of said intermediate frequency amplifier.

12. A spectrum analyzer as set forth in claim 11 wherein said intermediate frequency amplifier comprises a dual-gate field effect transistor, and said means for controlling the gain of said of intermediate frequency amplifier comprises means for producing a plurality of voltages, and switch means for selectively connecting one of said voltages to a gain control input of said field effect transistor.

13. A spectrum analyzer as set forth in claim 11 wherein said sensitivity control means further includes intermediate frequency filters.

14. A spectrum analyzer as set forth in claim 10, wherein said display means comprises a cathode ray tube having a deflection coil, and a means for driving said deflection coil, said driving means including an operational amplifier habving an internally biased output connected to one side of said driving coil for maintaining said one side of said driving coil at a predetermined voltage level.

15. A spectrum analyzer as set forth in claim 14 including means for changing the polarity of said deflection coil.

16. A spectrum analyzer comprising:
 a first means for receiving electromagnetic signals to be analyzed in a first frequency band;
 a second means for receiving electromagnetic signals to be analyzed in a second frequency band;
 means for up-converting said second frequency band signals to said first frequency band;
 means for down-converting signals in said first frequency band to an intermediate frequency, said down-converting means being connected to receive either signals from said first means or signals from said second means through said up-converting means; and
 means for displaying said down-converted signals.

17. A signal analyzer as claimed in claim 16, wherein said down-converting means comprises an image reject mixer having a variable frequency local oscillator, and means for sweeping said local oscillator through said first frequency band.

* * * * *